United States Patent
Emmermann et al.

(10) Patent No.: US 12,253,406 B2
(45) Date of Patent: Mar. 18, 2025

(54) GRAVIMETRIC MEASURING DEVICE

(71) Applicant: SARTORIUS LAB INSTRUMENTS GMBH & CO. KG, Goettingen (DE)

(72) Inventors: Bettina Emmermann, Goettingen (DE); Alexander Berger, Hardegsen (DE); Reinhold Feldmann, Obernfeld (DE); Winfried Graf, Goettingen (DE)

(73) Assignee: SARTORIUS LAB INSTRUMENTS GMBH & CO. KG, Goettingen (DE)

(*) Notice: Subject to any disclaimer, the term of this patent is extended or adjusted under 35 U.S.C. 154(b) by 399 days.

(21) Appl. No.: 17/891,708

(22) Filed: Aug. 19, 2022

(65) Prior Publication Data

US 2022/0404194 A1    Dec. 22, 2022

Related U.S. Application Data

(63) Continuation of application No. PCT/EP2021/053912, filed on Feb. 17, 2021.

(30) Foreign Application Priority Data

Feb. 20, 2020    (DE) .................... 10 2020 104 518.2

(51) Int. Cl.
*G01G 21/28*    (2006.01)
*G01G 19/14*    (2006.01)
(Continued)

(52) U.S. Cl.
CPC ............. *G01G 21/28* (2013.01); *G01G 19/14* (2013.01); *G01G 21/22* (2013.01); *G01G 21/23* (2013.01); *H05K 5/03* (2013.01); *H05K 7/18* (2013.01)

(58) Field of Classification Search
CPC ........ G01G 19/14; G01G 21/22; G01G 21/23; G01G 21/28; G01G 21/286; H05K 5/03; H05K 7/18
See application file for complete search history.

(56) References Cited

U.S. PATENT DOCUMENTS 7,012,198 B2    3/2006    Ludi et al.
10,197,435 B2    2/2019    Graf et al.
(Continued)

FOREIGN PATENT DOCUMENTS

CN    1450343 A    10/2003
CN    1654931 A    8/2005
(Continued)

OTHER PUBLICATIONS

Chinese Office Action with English translation, Application No. 202180015072.1, Mar. 13, 2024, 13 pages.
(Continued)

*Primary Examiner* — Randy W Gibson
(74) *Attorney, Agent, or Firm* — Edell, Shapiro & Finnan, LLC

(57) ABSTRACT

A gravimetric measuring device includes a weighing chamber with a vertical weighing chamber wall, which is formed as a support structure (14) with cover modules (28) detachably fixed thereto on the weighing chamber side, each cover module (28) having, on its weighing chamber side, a module front wall (30) covering the support structure (14) at least partially. The cover modules (28) have locking cantilevers (38) directed towards the support structure such that the locking cantilevers (38) are provided with vertically directed through-openings (40) which are aligned with corresponding through-openings (20, 22) of the support structure (14). The cover modules (28) are locked to the support structure (14) with locking rods (42) which pass through the mutually aligned through-openings (40; 20, 22) of the cover modules (28) and the support structure (14).

13 Claims, 4 Drawing Sheets

(51) Int. Cl.
*G01G 21/22* (2006.01)
*G01G 21/23* (2006.01)
*H05K 5/03* (2006.01)
*H05K 7/18* (2006.01)

(56) References Cited

U.S. PATENT DOCUMENTS

| | | | |
|---|---|---|---|
| 10,254,154 | B2 | 4/2019 | Kuhlmann et al. |
| 10,732,026 | B1 * | 8/2020 | Danenberg ........... H05K 5/0073 |
| 10,900,828 | B2 | 1/2021 | Meister et al. |
| 11,002,591 | B2 | 5/2021 | Buchmann et al. |
| 2005/0178591 | A1 | 8/2005 | Koppel et al. |
| 2010/0027621 | A1 | 2/2010 | Yano |
| 2010/0276213 | A1 | 11/2010 | Zeiss et al. |
| 2021/0364341 | A1 | 11/2021 | Staender et al. |
| 2021/0364342 | A1 | 11/2021 | Feldotte et al. |

FOREIGN PATENT DOCUMENTS

| | | |
|---|---|---|
| CN | 105723192 A | 6/2016 |
| CN | 110388976 A | 10/2019 |
| CN | 110388977 A | 10/2019 |
| DE | 102014101561 A1 | 2/2014 |
| DE | 102019102801 A1 | 8/2020 |
| DE | 102019102810 A1 | 8/2020 |
| EP | 1312902 A1 | 5/2003 |
| EP | 3557 199 A1 | 10/2019 |
| EP | 3557201 A1 | 10/2019 |
| WO | 2020161103 A1 | 8/2020 |

OTHER PUBLICATIONS

International Search Report, PCT/EP2021/053912, Jun. 7, 2021, 3 pages.
International Preliminary Report on Patentability, PCT/EP2021/053912, Aug. 23, 2022, 8 pages.

* cited by examiner

GRAVIMETRIC MEASURING DEVICE

CROSS REFERENCE TO RELATED APPLICATIONS

This is a Continuation of International Application PCT/EP2021/053912, which has an international filing date of Feb. 17, 2021, and which claims the priority of German Patent Application 10 2020 104 518.2, filed Feb. 20, 2020. The disclosures of both applications are incorporated in their respective entireties into the present Continuation by reference.

FIELD OF INVENTION

The invention relates to a gravimetric measuring device, comprising a weighing chamber with a vertical weighing chamber wall, which is formed as a support structure with cover modules detachably fixed thereto on the weighing chamber side, each cover module comprising, on its weighing chamber side, a module front wall covering the support structure at least partially, wherein the cover modules have locking cantilevers directed towards the support structure.

BACKGROUND

Generic gravimetric measuring devices are known from EP 3 557 199 A1.

Said publication discloses a balance with a housing enclosing a mechanical weighing system and a weighing sensor system coupled thereto and a weighing chamber adjacent thereto. A load receptor of the weighing system projects into the weighing chamber, on which the sample to be weighed can be positioned. The weighing chamber, at its lower side, bounded by a horizontal weighing chamber bottom and, at its upper side, by a likewise horizontal weighing chamber top. The weighing chamber shares a common vertical partition with the housing, which serves both as the front wall of the housing and as the rear wall of the weighing chamber. The remaining three sides of the weighing chamber are closed by a draft shield which can be opened in certain areas. The skilled person will understand that the terms "horizontal" and "vertical" in the context of the present description refer to the operating position (given by the direction of gravity) of the gravimetric weighing device. the above-mentioned publication discloses a modular structure of the weighing chamber rear wall. In particular, this is formed from a plurality of wall elements which can be arranged one above the other, so that it can be varied in height depending on the choice of the type and number of wall elements. The rear wall of the weighing chamber, which is made up of such wall elements, has recesses, the function of which is not described further in the publication. However, the recesses can be closed with panel-like cover modules. The cover modules essentially consist of a curved module front wall, from which latching cantilevers extend towards the support structure, wherein these latching cantilevers latching with corresponding latching elements of the support structure in the final assembly state. The cover modules, in particular their front walls, complement each other and the edges of the recesses on the support structure side flush with each other, resulting in a flush surface of the weighing chamber rear wall in the final assembled state.

The attachment of the cover modules to the support structure appears awkward. During assembly, the latching cantilevers must be inserted very precisely into narrow channels of the support structure and the cover modules must be inserted very precisely in the horizontal direction. In addition, since the actual latching points are not accessible in the final assembly state, the latching must not result in secure locking of the cover modules to the support structure, as otherwise it would not be possible to remove them again. However, this results in the cover modules being removable by the mere application of force and therefore removable by unauthorized personnel. The only "safeguard" for the cover modules is a correspondingly high dimensioning of the forces required for removal. However, in the context of highly filigree components, such as those regularly used in precision balances in particular, the application of high forces is generally contraindicated.

EP 1 312 902 A1 discloses a balance to the rear wall of which an additional electronic unit can be attached and in which supply units, e.g. a battery, or control electronics, can be arranged.

US 2010/0276213 A1 also discloses a balance with control electronics arranged on the rear wall of the weighing chamber. This is mechanically and electronically connected to a dosing nozzle arranged above the load receptor, so that the balance as a whole can be used as a dosing device.

DE 10 2014 101 561 A1 discloses a gravimetric dosing device with a climate measurement module arranged in the weighing chamber. Based on the climate data thus determined, components to be mixed can be pre-tempered outside the device during the dosing process.

The two subsequently published publications DE 10 2019 102 810 A1 and DE 2019 102 801 A1 each disclose balances the weighing chamber rear wall of which consists of a support structure with recesses that can be covered by interchangeable functional or cover panels adapted to the shape of the support structure. These publications are silent on the details of mechanical fixing of the covers.

SUMMARY

It is an object of the present invention to provide an improved fixation of the cover modules.

According to one formulation, this object is achieved with locking cantilevers that have vertically directed through-openings which are aligned with corresponding through-openings of the support structure. The above-noted cover modules are locked to the support structure with locking rods which pass through the mutually aligned through-openings of the cover modules and the support structure.

Instead of the known latching, the cover modules are fixed to the support structure with separate locking elements. The horizontally oriented locking cantilevers, which are provided with through-openings perpendicularly, in particular vertically, oriented thereto, can be brought into alignment with corresponding through-openings in the support structure, which are also aligned vertically, via an essentially horizontally aligned placement move. In this state, rod-shaped locking elements are pushed in a vertical direction through the pairs of through-openings, so that horizontal removal of the cover modules is reliably prevented. This becomes possible again only when the axially (or vertically) movable locking rods are pulled out of the pairs of through-openings. Then, however, the horizontal removal of the cover modules is possible essentially without any forces. A concealed arrangement of the upper rod ends in the final assembly state, which is accessible only with a key or with a special tool, can counteract unauthorized removal or unauthorized replacement or manipulation of cover modules or of elements covered by the cover modules.

The cover modules can be fixed in the vertical direction, for example, by resting the locking cantilevers on corresponding elements of the support structure and/or by resting the cover modules on each other.

The locking rods pass through the aligned through-openings, preferably in a form-fit manner, so that the cover modules are locked to the support structure largely without play. If the length of the through-openings is sufficient, such a form fit not only provides, to a great extent, freedom from play with respect to movements in the horizontal direction but also with respect tilt movements.

In the preferred case of several cover modules stacked vertically one on top of the other, their pre-fixation to the support structure with subsequent joint locking with locking rods which pass through the vertically stacked through-openings of several, preferably all, cover modules has proven to be favorable. For practical implementation, it is preferred if the cover modules each have pre-fixation cantilevers directed towards the support structure with module-side latching elements which are reversibly latched with corresponding latching elements of the support structure. However, as explained, since these latches serve only for temporary pre-fixation, they can be designed such that even very low pull-off forces are sufficient to overcome this (pre-)fixation. The actual locking, i.e., final fixation to the support structure which cannot be overcome by (arbitrarily high) pull-off forces, is achieved by inserting the locking bars.

It is particularly preferred if two pairs of interlocked latching elements form a pivotable linkage of the respective cover module to the support structure about a horizontal pivot axis parallel to the wall. This can be achieved, for example and preferably, by designing the latching elements on the support structure side as laterally displaceable, spring-biased ball elements and the latching elements on the module side as corresponding articulate pans. Such a pivotable pre-fixation is considered particularly favorable because it does not require any high-precision positioning and guidance of the cover module during pre-fixation on the support structure. Instead, it is sufficient to align the latching elements on the support structure side roughly with the latching elements on the module side. The corresponding latching elements are nevertheless snapped into one another reliably, which means error tolerance during assembly and therefore significant time savings. Pre-fixation of this kind results in the cover modules already being correctly positioned vertically and horizontally; only a degree of swivel freedom is retained, but this is canceled out by positive insertion of the locking rods, as already explained above.

It is feasible to design the cover modules as elements consisting essentially of their module front wall and the locking and possibly the pre-fixation cantilevers. In many cases, however, it is more favorable if the cover modules have module edge walls extending from the respective module front wall to the support structure and aligned perpendicular to the module front wall. In the preferred case of module edge walls extending around the edge of the module front wall, the cover modules have essentially an open box-like shape. However, it is by no means mandatory for the module front wall to be completely surrounded by module edge walls.

However, if the module edge walls comprise at least a lower module wall on the bottom side and an upper module wall arranged opposite the latter, it is preferably provided that the locking cantilevers are designed as tabs arranged on the free edge of the upper and lower module walls. These can be inserted, for example, into corresponding slots in the support structure so that the free edges of the module edge walls otherwise rest against the support structure and—at least in the case of the open box-like shape of the cover module—form a closed cavity with the support structure.

The same applies to the pre-fixation cantilevers. In the case that the module edge walls comprise at least two vertically aligned module side walls, it is preferred that the pre-fixation cantilevers are designed as tabs arranged on the free edge of the module side walls.

When the support structure is fully equipped with cover modules, the module front walls preferably together form a cover surface covering the entire support structure. This then acts as the actual weighing chamber boundary.

The module front walls preferably form a flat cover surface together.

It is, of course, feasible that the module front walls are in direct contact with the support structure in the final assembly state. In this case, the covers would essentially have the function of easily replaceable or cleanable contamination protection. In a further embodiment of the invention, however, it is provided that at least one of the cover modules covers an empty space of the support structure in which a primary electronic unit is arranged and fixed to the support structure. In this case, the cover module thus serves specifically to laminate and possibly even encapsulate electronic functional units with which the balance is preferably variably equipped. Thus, suitable interfaces for this primary electronic unit can be arranged on the support structure. For example, these are electrical, data, identification and/or thermal interface components. The actual equipping of the balance with corresponding electronic primary units is carried out as needed and according to customer requirements. The electronic primary units are then shielded from the weighing chamber by the cover modules. The aforementioned empty space can be a recess in the support structure, an intermediate space between the support structure and the module front wall, or a combination thereof. In particular, it can be constituted, at least in some areas, by the module edge walls described above and/or by windows in the support structure, which is designed, for example, as a framework made up of posts and cross struts.

In a further development of this embodiment, it is provided that the module front wall of the cover module covering the primary electronic unit carries a secondary unit connected to it. For example, the primary electronic unit can contain an electronic interface to the weighing sensor or to the control electronics controlling it, and the secondary unit can be designed as a digital display coupled to it. As a further example of an embodiment, a primary electronic unit designed as an illumination control unit and a secondary unit designed as an illuminant may be mentioned. Other embodiments include ionization units, temperature control modules, climate sensors, etc.

Alternatively or additionally, however, it is also possible for the module front wall to carry a passive functional unit or an active functional unit without an upstream primary electronic unit on the support structure. In general, the possible embodiments in this respect can be summarized by the fact that the module front wall of at least one cover module carries a functional unit projecting into the weighing chamber.

Further features and advantages of the invention will be apparent from the following specific description and drawings.

BRIEF DESCRIPTION OF THE DRAWINGS

It shows.

DETAILED DESCRIPTION

Identical reference signs in the figures indicate identical or analogous elements.

Figure 1:
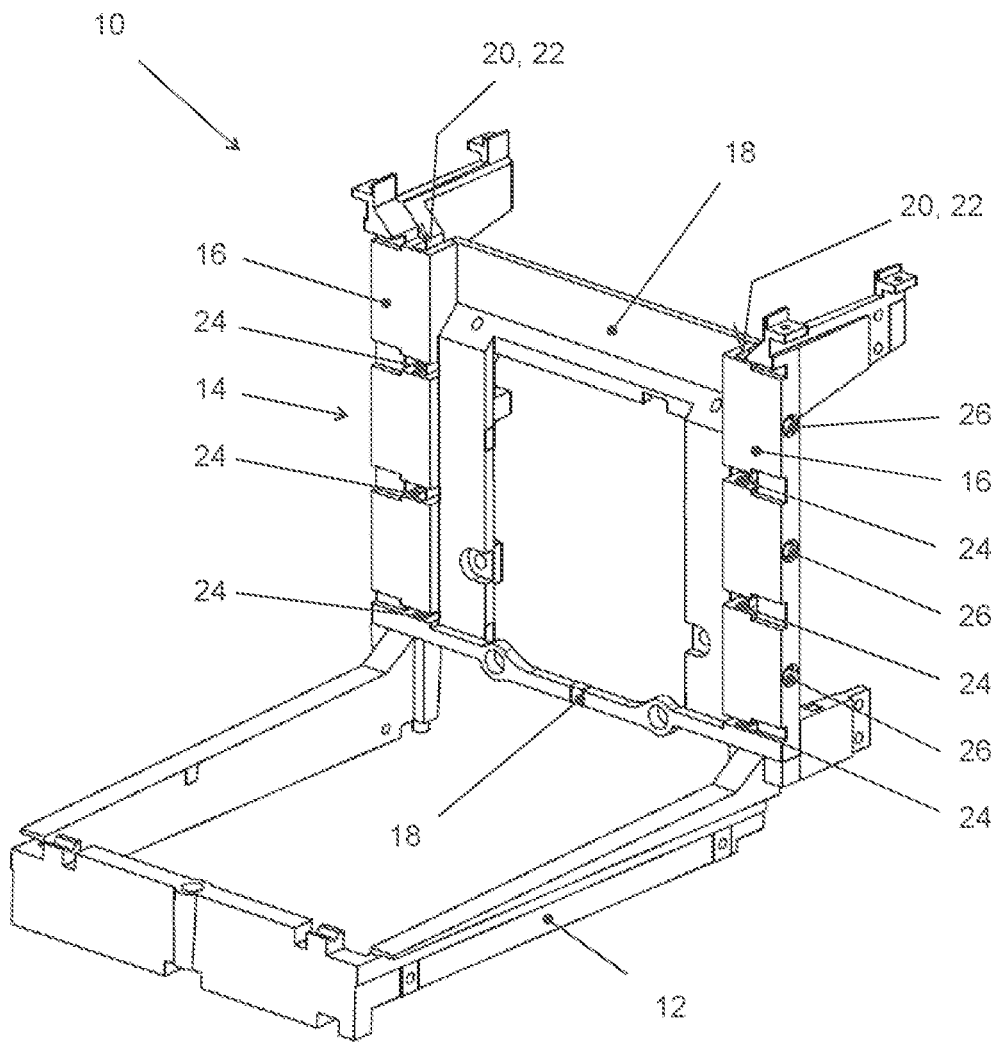
FIG. 1: A base element of a measuring device according to the invention with a support structure for a weighing chamber rear wall.

FIG. 1 shows an element, referred to as base element 10, of a base of an embodiment of a gravimetric measuring device according to the invention. The base element 10 comprises a bottom support 12 which is not further relevant in the context of the present invention and on which the weighing chamber bottom is fixed in the final assembled state. However, relevant in the context of the present invention is the vertical portion of the base element 10 which constitutes a support structure 14 as a component of a weighing chamber rear wall formed in accordance with the present invention. In the embodiment shown, the support structure 14 comprises two vertical posts 16 which are connected to each other through two horizontal struts 18. The posts 16 each have a vertical guide channel 20, the interior of which is accessible via upper insertion through-openings 22 and via lateral slots 24.

Figure 3:
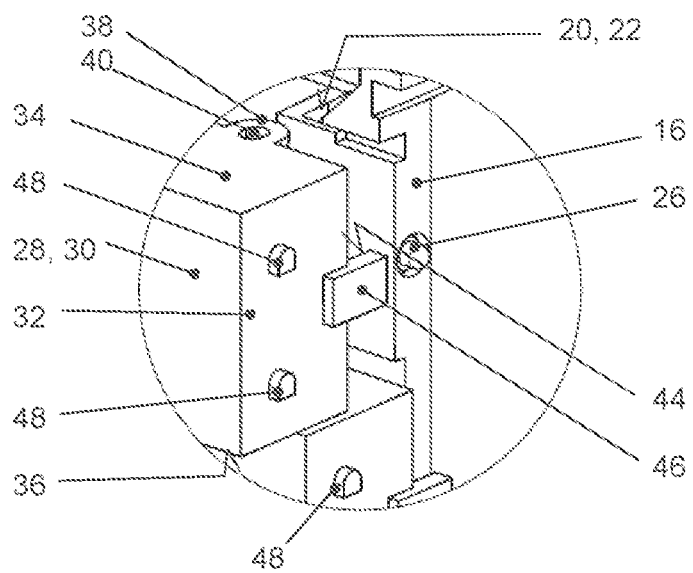
FIG. 3: a detailed view illustrating the pre-fixation.

The lateral outer sides of the posts 16 are provided with latching elements 26, which will be discussed in more detail below, particularly in the context of FIG. 3.

Figure 2:
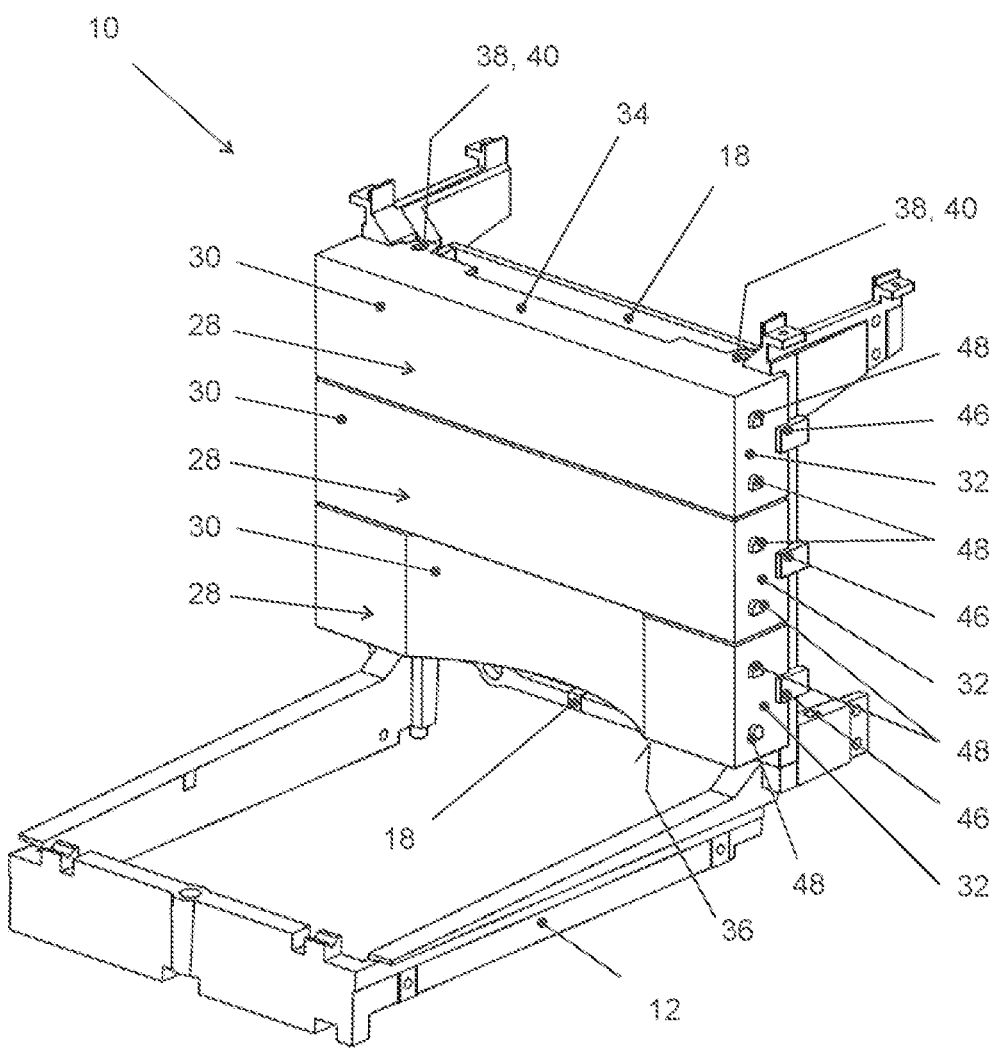
FIG. 2: the base element of FIG. 1 with cover modules prefixed to the support structure.
Figure 5:
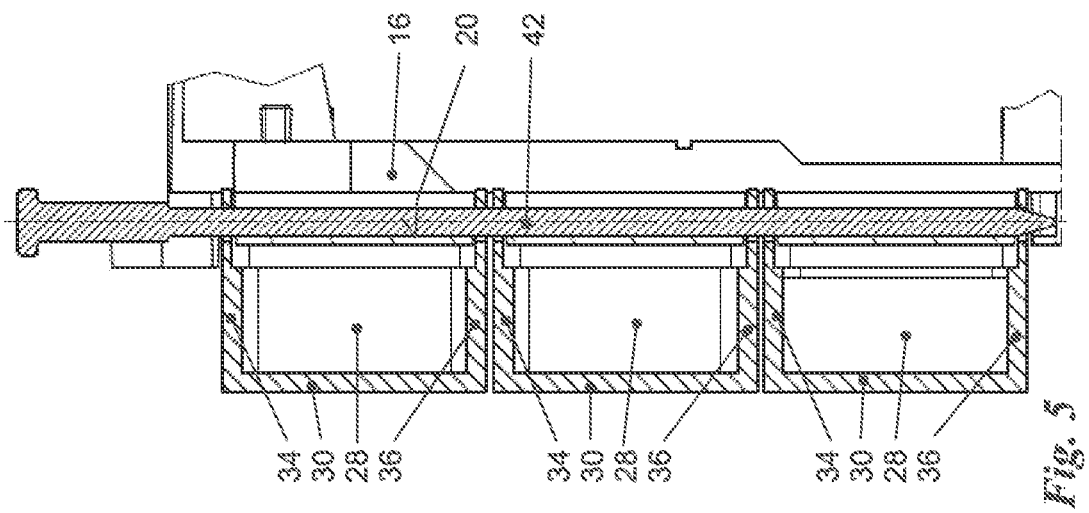
FIG. 5: a sectional view through the base element of FIG. 4 in the area of a locking rod.
Figure 4:
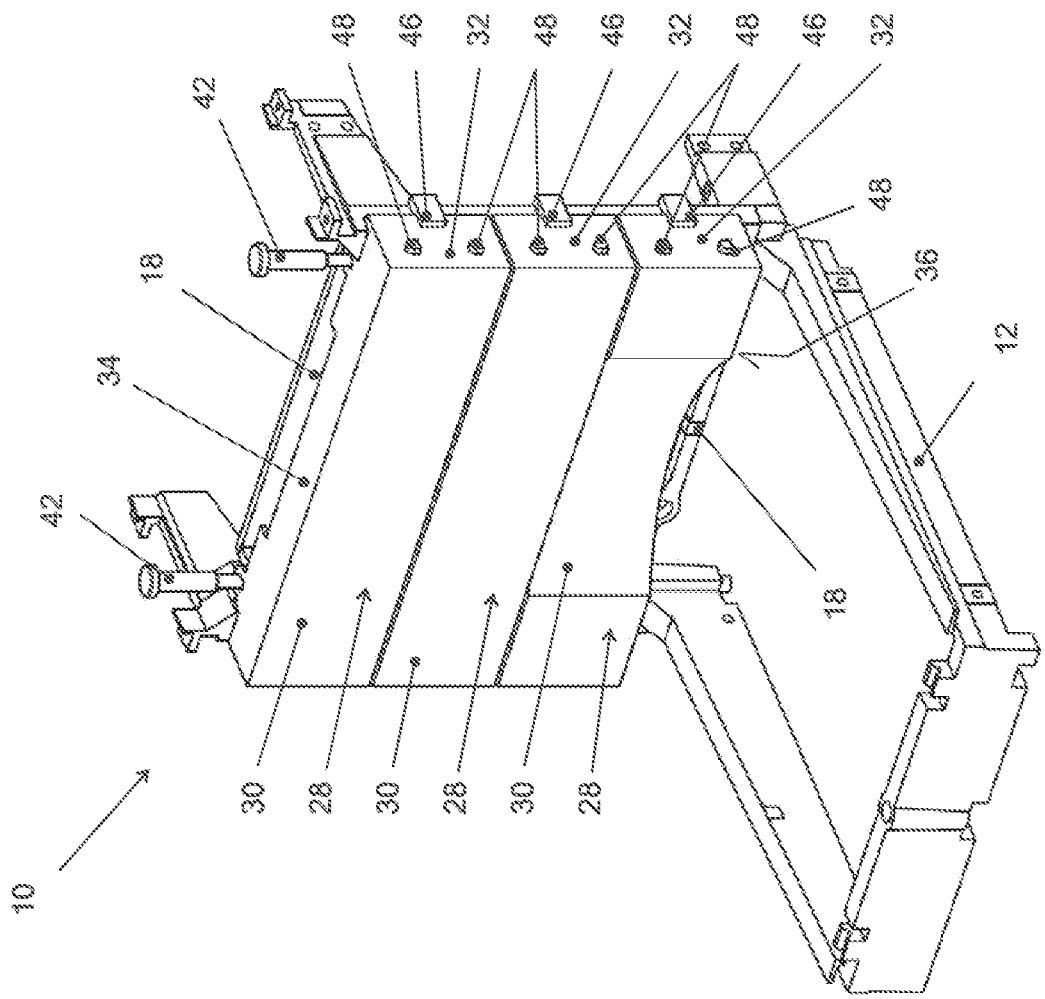
FIG. 4: the base element of FIG. 2 with interlocked cover modules.

FIG. 2 shows the base member 10 of FIG. 1 with cover modules 28 prefixed thereto. FIG. 3 shows a detail illustrating the pre-fixation of the uppermost cover module 28. FIGS. 4 and 5 show the same base member with cover modules locked thereto. The figures will be discussed together below.

In the embodiment shown, the cover modules 28 are openly box-shaped and for this purpose have a module front wall 30, module side walls 32 and in each case an upper module wall 34 and a lower module wall 36. At their edges on the support structure side, the upper and lower module walls each have two lug-shaped locking cantilevers 38, each with a vertical through-opening 40. In the pre-fixation position of the cover modules 28 shown, the through-openings 40 are aligned with the insertion through-openings 22 of the guide channels 20. The locking extensions 38 on the lower module wall 36 of the uppermost cover module 28 and on the upper and lower module walls 34, 36 of the lower cover modules 28, which are not visible in FIG. 2, engage in the lateral slots 24 of the posts 16 so that their through-openings 40 are also aligned with the guide channels 20. To lock the cover modules 28 to the support structure 14, locking rods 42 are inserted through the through-openings 40 and into the guide channels 20, as shown in FIGS. 4 and 5. In this way, the cover modules 28 are reliably secured against being pulled off.

In the embodiment shown, however, the cover modules 28 are already prefixed to the support structure 14 without the locking rods 42. For this purpose, latching elements 26 on the support structure are latched to latching elements 44 on the module. The support structure-side latching elements 26 are formed as laterally outwardly projecting pins provided with hemispherical heads, which are spring-preloaded laterally outwardly in corresponding bearing channels. The module-side latching elements 44 are formed correspondingly as articulate pans (not shown in greater detail), and are seated on the inner sides of pre-fixation cantilevers 46, which extend from the module side walls 32 of the cover modules 28 towards the support structure side. When the cover modules 28 are mated, the hemispherical heads are pushed laterally inward by the pre-fixation cantilevers 46 against their spring force to snap into their respective ball sockets in the mated end position. This ensures a pre-fixation allowing only one degree of swivel freedom.

Figure 6:
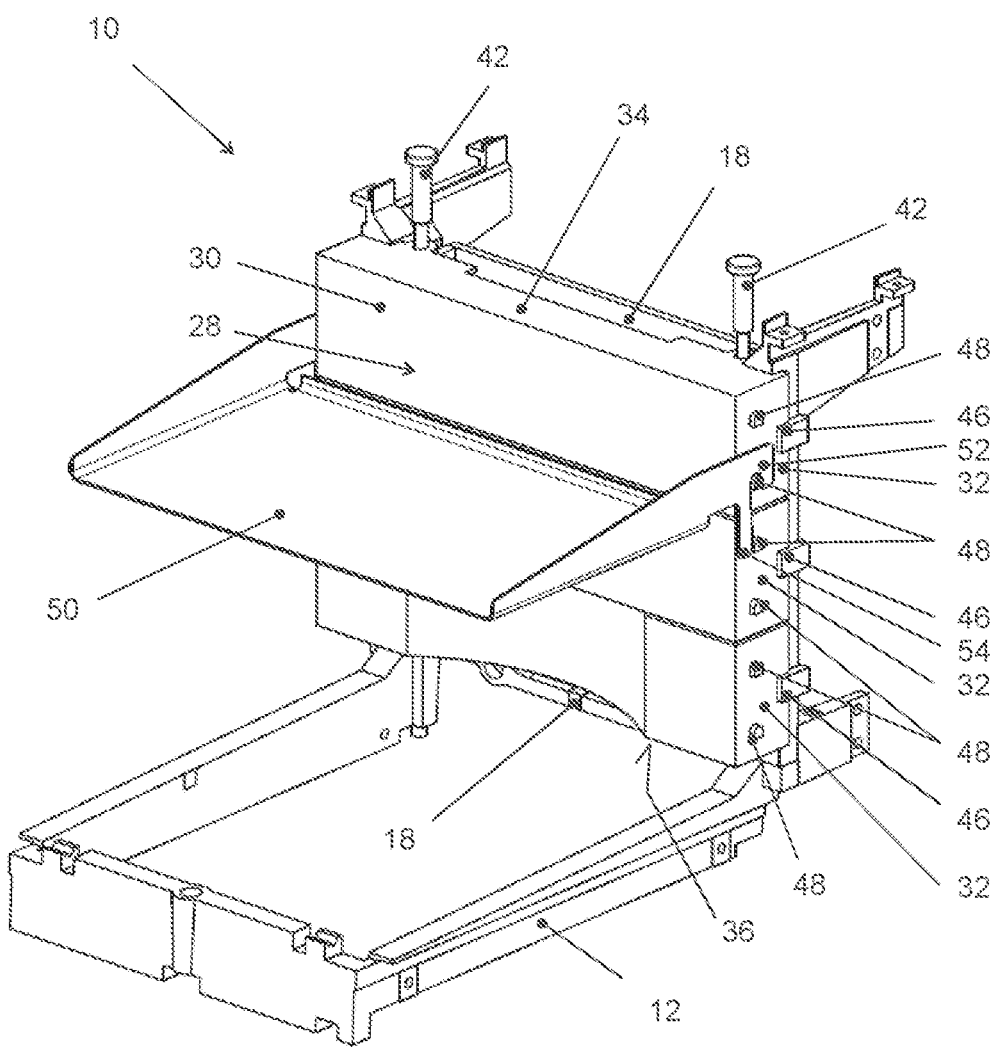
FIG. 6: the base element of FIG. 4 with an additionally suspended tray.
Figure 7:
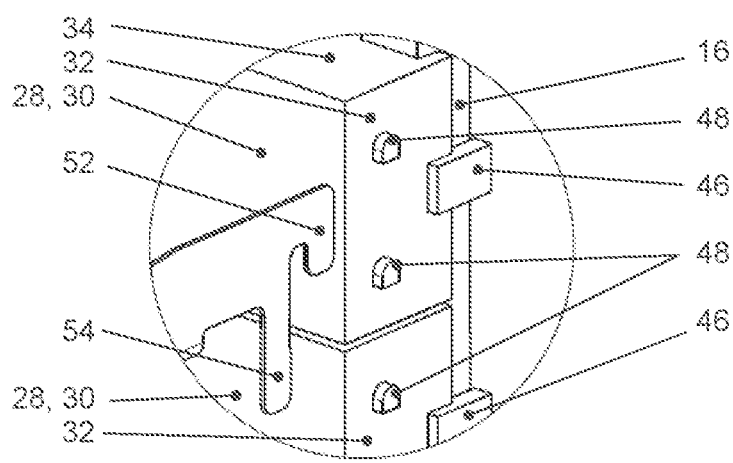
FIG. 7: a detailed view illustrating the suspension of the tray.

FIGS. 6 and 7 illustrate a particularly advantageous further development of the cover modules 28 according to the invention. In the embodiment shown, these carry laterally projecting protrusions 48 with rounded upper edges on their module side walls 32. The side and bottom edges of the protrusions 48 are each straight in the embodiment shown. The protrusions 48 can be used, as can be seen in particular in FIG. 6, as a holder for additional modules projecting into the weighing chamber, in the embodiment shown a tray 50 projecting into the weighing chamber. For this purpose, the tray 50 has lateral hooks 52 which can be positively suspended over the protrusions 48. To prevent the tray 50 from folding away downward under the force of gravity, the trays have additional support levers 54 which are supported on the side edge of the next lower projection 48 on the weighing chamber side. Details of this construction are shown enlarged in FIG. 7.

The embodiments discussed in the specific description and shown in the figures are only illustrative examples of embodiments of the present invention. The person skilled in the art is provided with a wide range of possible variations in light of the present disclosure. For example, it is feasible to install other additional modules, such as a dosing aid, density determination accessories, etc., as alternatives to or in addition to the described tray 50.

LIST OF REFERENCE SIGNS 10 base element
12 bottom support
14 support structure
16 post
18 strut
20 guide channel
22 insertion through-opening
24 slot
26 support structure side latching element
28 cover module
30 module front wall
32 module side wall
34 upper module wall
36 lower module wall
38 locking cantilever
40 through-opening
42 locking rod
44 module side latching element
46 pre-fixation cantilever
48 protrusion
50 tablet 52 hooks
54 support lever

What is claimed is:

1. Gravimetric measuring device, comprising:
a weighing chamber with a vertical weighing chamber wall, which is formed as a support structure with cover modules detachably fixed to the support structure on a weighing chamber side of the support structure,
wherein each of the cover modules comprises, on a weighing chamber side of the cover modules, a module front wall covering the support structure at least partially,
wherein the cover modules have locking cantilevers directed towards the support structure,
wherein the locking cantilevers have vertically directed through-openings which are aligned with corresponding through-openings of the support structure as mutually aligned through-openings, and
wherein the cover modules lock to the support structure with locking rods which pass through the mutually aligned through-openings of the cover modules and the support structure.

2. Gravimetric measuring device according to claim 1, wherein the locking rods positively pass through the mutually aligned through-openings.

3. Gravimetric measuring device according to claim 1, wherein the cover modules each have pre-fixation cantilevers directed towards the support structure, the pre-fixation cantilevers having module-side latching elements which reversibly latch with corresponding latching elements of the support structure.

4. Gravimetric measuring device according to claim 3, wherein, in each case, two pairs of the latching elements latched to one another form an articulation of the respective cover module on the support structure, which articulation is configured to pivot about a horizontal pivot axis parallel to the wall.

5. Gravimetric measuring device according to claim 3, wherein the latching elements on the support structure side are configured as laterally displaceable, spring-biased ball elements, and the latching elements on the module side are configured as corresponding articulate pans.

6. Gravimetric measuring device according to claim 1, wherein the cover modules each have module edge walls that extend from the respective module front walls towards the support structure and are aligned perpendicularly to the respective module front wall.

7. Gravimetric measuring device according to claim 6, wherein the module edge walls comprise a lower module wall on a bottom side and an upper module wall arranged opposite to the bottom side, and the locking cantilevers are formed as tabs arranged at free edges of the upper and the lower module walls.

8. Gravimetric measuring device according to claim 6, wherein the module edge walls comprise two vertically aligned module side walls, and the pre-fixation cantilevers are formed as tabs arranged at free edges of the module side walls.

9. Gravimetric measuring device according to claim 1, wherein the module front walls together form a covering surface covering an entirety of the support structure.

10. Gravimetric measuring device according to claim 1, wherein the module front walls together form a flat covering surface.

11. Gravimetric measuring device according to claim 1, wherein at least one of the cover modules covers an empty space of the support structure, in which a primary electronic unit is arranged and fixed to the support structure.

12. Gravimetric measuring device according to claim 11, wherein the module front wall of the cover module covering the primary electronic unit carries a secondary unit connected thereto.

13. Gravimetric measuring device according to claim 1, wherein the module front wall of at least one of the cover modules carries a functional unit projecting into the weighing chamber.

* * * * *